(12) United States Patent
Lin et al.

(10) Patent No.: US 10,109,608 B2
(45) Date of Patent: Oct. 23, 2018

(54) SEMICONDUCTOR PACKAGE (71) Applicant: MediaTek Inc., Hsin-Chu (TW)

(72) Inventors: Tzu-Hung Lin, Zhubei (TW);
Wen-Sung Hsu, Zhubei (TW); Tai-Yu Chen, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/189,369

(22) Filed: Jun. 22, 2016

(65) Prior Publication Data

US 2016/0307863 A1 Oct. 20, 2016

Related U.S. Application Data

(63) Continuation of application No. 13/430,439, filed on Mar. 26, 2012, now abandoned.

(Continued)

(51) Int. Cl.
*H01L 21/00* (2006.01)
*H01L 23/00* (2006.01)
(Continued)

(52) U.S. Cl.
CPC ........ *H01L 24/14* (2013.01); *H01L 23/49838* (2013.01); *H01L 24/04* (2013.01); *H01L 24/05* (2013.01); *H01L 24/11* (2013.01); *H01L 24/13* (2013.01); *H01L 24/16* (2013.01); *H01L 23/3192* (2013.01); *H01L 24/17* (2013.01); *H01L 2224/0219* (2013.01); *H01L 2224/02125* (2013.01); *H01L 2224/02165* (2013.01); *H01L 2224/02166* (2013.01); *H01L 2224/02181* (2013.01); *H01L 2224/0401* (2013.01); *H01L 2224/05572* (2013.01); *H01L 2224/11462* (2013.01); *H01L 2224/131* (2013.01); *H01L 2224/13006* (2013.01);
(Continued)

(58) Field of Classification Search
CPC .......... H01L 24/14–24/16; H01L 2224/02125; H01L 2224/01126; H01L 2224/02165; H01L 2224/02166
See application file for complete search history.

(56) References Cited

U.S. PATENT DOCUMENTS 3,871,015 A * 3/1975 Lin .................. H01L 24/12
228/180.22
4,005,472 A * 1/1977 Harris .................. H01L 21/288
205/123

(Continued)

FOREIGN PATENT DOCUMENTS

EP 1 239 514 A3 6/2003
TW 2005/09346 A 3/2005
(Continued)

*Primary Examiner* — David Zarneke
(74) *Attorney, Agent, or Firm* — Wolf, Greenfield & Sacks, P.C.

(57) ABSTRACT

The invention provides a semiconductor package. The semiconductor package includes a semiconductor die having a central area and a peripheral area surrounding the central area. A first conductive bump is disposed on the semiconductor die in the central area. A second conductive bump is disposed on the semiconductor die in the peripheral area. An area ratio of the first conductive bump to the second conductive bump from a top view is larger than 1, and less than or equal to 3.

19 Claims, 8 Drawing Sheets

Related U.S. Application Data (60) Provisional application No. 61/478,791, filed on Apr. 25, 2011.

(51) Int. Cl.
 *H01L 23/498* (2006.01)
 *H01L 23/31* (2006.01)

(52) U.S. Cl.
 CPC ............... *H01L 2224/13016* (2013.01); *H01L 2224/13083* (2013.01); *H01L 2224/13147* (2013.01); *H01L 2224/13155* (2013.01); *H01L 2224/1403* (2013.01); *H01L 2224/16238* (2013.01); *H01L 2224/27013* (2013.01); *H01L 2224/32225* (2013.01); *H01L 2224/73204* (2013.01); *H01L 2924/00014* (2013.01); *H01L 2924/014* (2013.01); *H01L 2924/01029* (2013.01); *H01L 2924/01033* (2013.01); *H01L 2924/01075* (2013.01); *H01L 2924/07025* (2013.01); *H01L 2924/18161* (2013.01)

(56) References Cited

U.S. PATENT DOCUMENTS

| | | | |
|---|---|---|---|
| 4,188,438 A * | 2/1980 | Burns | H01L 24/10 148/253 |
| 4,545,610 A | 10/1985 | Lakritz et al. | |
| 4,733,289 A * | 3/1988 | Tsurumaru | H01L 21/31 257/640 |
| 5,430,329 A * | 7/1995 | Harada | H01L 23/485 257/639 |
| 5,569,960 A * | 10/1996 | Kumazawa | H01L 23/3128 257/738 |
| 5,989,937 A | 11/1999 | Variot et al. | |
| 6,053,394 A | 4/2000 | Dockerty et al. | |
| 6,077,726 A * | 6/2000 | Mistry | H01L 24/03 257/E23.021 |
| 6,107,685 A | 8/2000 | Nishiyama | |
| 6,198,169 B1 * | 3/2001 | Kobayashi | H01L 24/11 257/737 |
| 6,534,875 B1 | 3/2003 | Nishiyama | |
| 6,541,857 B2 | 4/2003 | Caletka et al. | |
| 6,624,004 B2 * | 9/2003 | Lee | H01L 24/10 257/E21.511 |
| 6,642,136 B1 * | 11/2003 | Lee | H01L 21/563 257/E21.503 |
| 6,669,079 B2 * | 12/2003 | Li | B23K 35/025 148/23 |
| 6,674,162 B2 | 1/2004 | Takao | |
| 6,734,566 B2 | 5/2004 | Honda | |
| 6,750,549 B1 | 6/2004 | Chandran et al. | |
| 6,809,020 B2 * | 10/2004 | Sakurai | H01L 23/3128 257/E21.508 |
| 6,888,255 B2 * | 5/2005 | Murtuza | H01L 23/49811 228/180.22 |
| 6,940,169 B2 * | 9/2005 | Jin | H01L 24/11 257/737 |
| 6,940,176 B2 | 9/2005 | Chen | |
| 7,098,540 B1 * | 8/2006 | Mohan | H01L 24/03 257/737 |
| 7,514,295 B2 * | 4/2009 | Mizukoshi | H01L 21/563 257/E21.511 |
| 7,541,217 B1 * | 6/2009 | Shih | H01L 25/0657 257/777 |
| 7,855,461 B2 * | 12/2010 | Kuo | H01L 22/32 257/780 |
| 7,880,256 B2 * | 2/2011 | Takai | H01L 23/3192 257/383 |
| 7,902,679 B2 * | 3/2011 | Lin | H01L 23/49816 257/737 |
| 7,906,835 B2 | 3/2011 | Romero | |
| 8,021,796 B2 * | 9/2011 | Zuber | H01M 8/0273 427/115 |
| 8,193,035 B2 * | 6/2012 | Pendse | H01L 24/03 257/E21.519 |
| 8,318,537 B2 * | 11/2012 | Pendse | H01L 21/563 257/778 |
| 8,337,735 B2 | 12/2012 | Goldmann | |
| 8,344,505 B2 | 1/2013 | Mclellan et al. | |
| 8,349,721 B2 * | 1/2013 | Shim | H01L 21/50 257/779 |
| 9,219,045 B2 * | 12/2015 | Pendse | H01L 21/563 |
| 9,349,699 B2 * | 5/2016 | Huang | H01L 24/11 |
| 9,646,923 B2 * | 5/2017 | Tseng | H01L 23/49816 |
| 9,679,811 B2 * | 6/2017 | Pendse | H01L 21/76885 |
| 2003/0114024 A1 | 6/2003 | Miyagawa | |
| 2004/0020045 A1 * | 2/2004 | Hirano | H01L 21/288 29/846 |
| 2005/0233571 A1 | 10/2005 | Tao et al. | |
| 2006/0255473 A1 * | 11/2006 | Pendse | H01L 24/10 257/778 |
| 2006/0292711 A1 * | 12/2006 | Su | G01R 31/046 438/14 |
| 2007/0102815 A1 * | 5/2007 | Kaufmann | H01L 24/11 257/737 |
| 2008/0048321 A1 | 2/2008 | Chan | |
| 2008/0213941 A1 * | 9/2008 | Pendse | H01L 21/563 438/108 |
| 2009/0057887 A1 | 3/2009 | Mclellan et al. | |
| 2009/0250811 A1 * | 10/2009 | Pendse | H01L 21/563 257/737 |
| 2011/0186987 A1 * | 8/2011 | Wang | H01L 23/3192 257/737 |
| 2012/0267779 A1 | 10/2012 | Lin et al. | |

FOREIGN PATENT DOCUMENTS

| | | |
|---|---|---|
| TW | 2006/10117 A | 3/2006 |
| TW | 2006/13431 A | 5/2006 |

* cited by examiner

SEMICONDUCTOR PACKAGE

CROSS REFERENCE TO RELATED APPLICATIONS

This application is a continuation of U.S. patent application Ser. No. 13/430,439 filed Mar. 26, 2012, which claims the benefit of U.S. Provisional Application No. 61/478,791 filed Apr. 25, 2011, each of which is hereby incorporated by reference in its entirety.

BACKGROUND OF THE INVENTION

1. Field of the Invention

The present invention relates to a semiconductor package, and in particular, to a conductive bump design for a semiconductor package.

2. Description of the Related Art

For a semiconductor chip package design, an increased amount of input/output (I/O) connections for multi-functional chips is required. The impact of this will be pressure on printed circuit board (PCB) fabricators to minimize linewidth and space or to develop direct chip attach (DCA) semiconductors. However, the increased amount of input/output connections of a multi-functional chip package may induce thermal electrical problems, for example, problems with heat dissipation, cross talk, signal propagation delay, electromagnetic interference for RF circuits, etc. The thermal electrical problems may affect the reliability and quality of products.

Thus, a novel semiconductor package with better thermal and electrical properties is desirable.

BRIEF SUMMARY OF INVENTION

A semiconductor package is provided. An exemplary embodiment of a semiconductor package comprises a semiconductor die having a central area and a peripheral area surrounding the central area. A first conductive bump is disposed on the semiconductor die in the central area. A second conductive bump is disposed on the semiconductor die in the peripheral area, wherein an area ratio of the first conductive bump to the second conductive bump from a top view is larger than 1, and less than or equal to 3.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 1A:
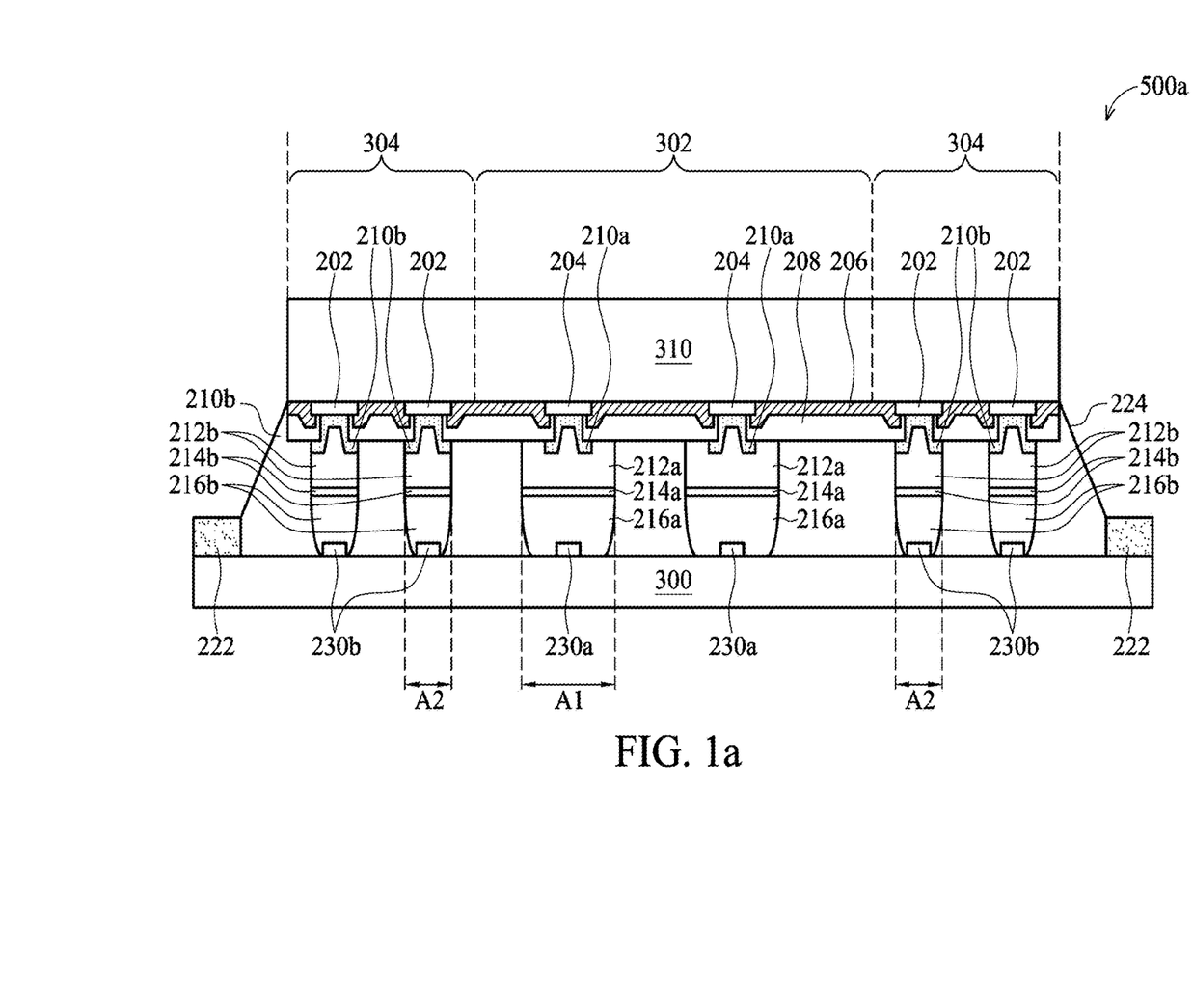
FIG. 1a shows a cross section view of one exemplary embodiment of a semiconductor package of the invention.

FIG. 1a shows a cross section view of one exemplary embodiment of a semiconductor package 500a of the invention. One exemplary embodiment of a semiconductor package 500a is a flip chip package using copper pillars connecting to a semiconductor die and a substrate. As shown in FIG. 1a, one exemplary embodiment of a semiconductor package 500a comprises a semiconductor die 310 having a central area 302 and a peripheral area 304 surrounding the central area 302. The metal pads 202 and 204 belong to the uppermost metal layer of the interconnection structure (not shown) of the semiconductor die 310. In this embodiment, the metal pads 204 arranged in the central area 302 are used to transmit ground or power signals of the semiconductor die 310, and the metal pads 202 arranged in the peripheral area 304 are used to transmit signals of the semiconductor die 310. Therefore, the metal pads 204 may serve as ground or power pads, and the metal pads 202 may serve as signal pads. In one embodiment, a minimum pitch of the metal pads 204 in the central area 302 may be designed larger than a minimum pitch designed for the metal pads 202 in the peripheral area 304, which also serves as the minimum pitch for the metal pads of the design rule of the semiconductor package 500a.

As shown in FIG. 1a, a first passivation layer 206 is conformably formed covering the metal pads 202 and 204 by a deposition and patterning processes. In one embodiment, the first passivation layer 206 may comprise oxide, nitride, or oxynitride. The first passivation layer 206 has openings on the metal pads 202 and 204, so that a portion of the metal pads 202 and 204 are respectively exposed from the openings. Also, a second passivation layer 208 is formed by a coating patterning and curing process. In one embodiment, the second passivation layer 208 with openings therethrough may comprise polyimide for providing reliable insulation when the semiconductor die 310 is subjected to various types of environmental stresses. A portion of the metal pads 202 and 204 are respectively exposed from the openings of the second passivation layer 208. In this embodiment, the metal pads 204 are arranged in the central area 302, and the metal pads 202 are arranged in the peripheral area 304.

As shown in FIG. 1a, under bump metallurgy (UBM) layer patterns 210a and 210b are formed on the passivation layer 208 by a deposition method such as a sputtering or plating method and a subsequent anisotropic etching process. The anisotropic etching process is performed after forming conductive pillars. Meanwhile, the UBM layer patterns 210a and 210b line sidewalls and bottom surfaces of the openings of the passivation layer 208. In this embodiment, the UBM layer patterns 210a are arranged in the central area 302, and the UBM layer patterns 210b are arranged in the peripheral area 304. Also, the UBM layer patterns 210a and 210b extend over a top surface of the passivation layer 208. In one embodiment, the UBM layer patterns 210a and 210b are composed of a Ti layer and a Cu layer on the Ti layer. In one embodiment, the UBM layer patterns 210a arranged in the central area 302 are designed in a shape different from that of the UBM layer patterns 210b arranged in the peripheral area 304 from the top view. For example, the UBM layer patterns 210a arranged in the central area 302 are designed in a circular shape and the UBM layer patterns 210b arranged in the peripheral area 304 are designed in a rectangular shape from the top view.

As shown in FIG. 1a, the conductive pillars 212a and 212b are respectively formed on the UBM layer patterns 210a and 210b, filling the openings of the passivation layer 208. In this embodiment, the conductive pillars 212a are arranged in the central area 302, and the conductive pillars 212b are arranged in the peripheral area 304. Formation positions of the conductive pillars 212a and 212b are defined by a dry film photoresist or liquid photoresist patterns (not shown). In one embodiment, the conductive pillars 212a and 212b are used as a solder joint for subsequent conductive bumps, which are used to transmit input/output (I/O), ground or power signals of the semiconductor die 310, disposed thereon. Therefore, the conductive pillars 212a and 212b may help to increase the mechanical strength of the bump structure. In one embodiment, the conductive pillars 212a and 212b may be formed of copper, so that deformation may be prevented during a subsequent solder re-flow process.

As shown in FIG. 1a, conductive buffer layers 214a and 214b are formed on the conductive pillars 212a and 212b by an electroplating method. In this embodiment, the conductive buffer layers 214a are arranged in the central area 302, and the conductive buffer layers 214b are arranged in the peripheral area 304. In one embodiment, the conductive buffer layer 240 is an optional element serving as a seed layer, an adhesion layer and a barrier layer for a subsequent conductive bump formed thereon. In one embodiment, the conductive buffer layers 214a and 214b may comprise Ni.

As shown in FIG. 1a, conductive bumps 216a and 216b are respectively formed on the conductive buffer layers 214a and 214b by electroplating a solder with a patterned photoresist layer or by a screen printing process and a subsequent solder re-flow process. In this embodiment, the conductive bumps 216a are arranged in the central area 302, and the conductive bumps 216b are arranged in the peripheral area 304. In one embodiment, the conductive bumps 216a electrically connect to the metal pads 204, which are used to transmit ground or power signals of the semiconductor die 310, and the conductive bumps 216b electrically connect to the metal pads 202, which are used to transmit signals of the semiconductor die 310. In one embodiment of the invention, the conductive pillars 212a/212b, the overlying conductive bumps 216a/216b and the conductive buffer layers 214a/214b (optional) therebetween, collectively form bump structures. Additionally, the semiconductor die 310 and the bump structures collectively form a semiconductor package 500a.

Figure 1B:
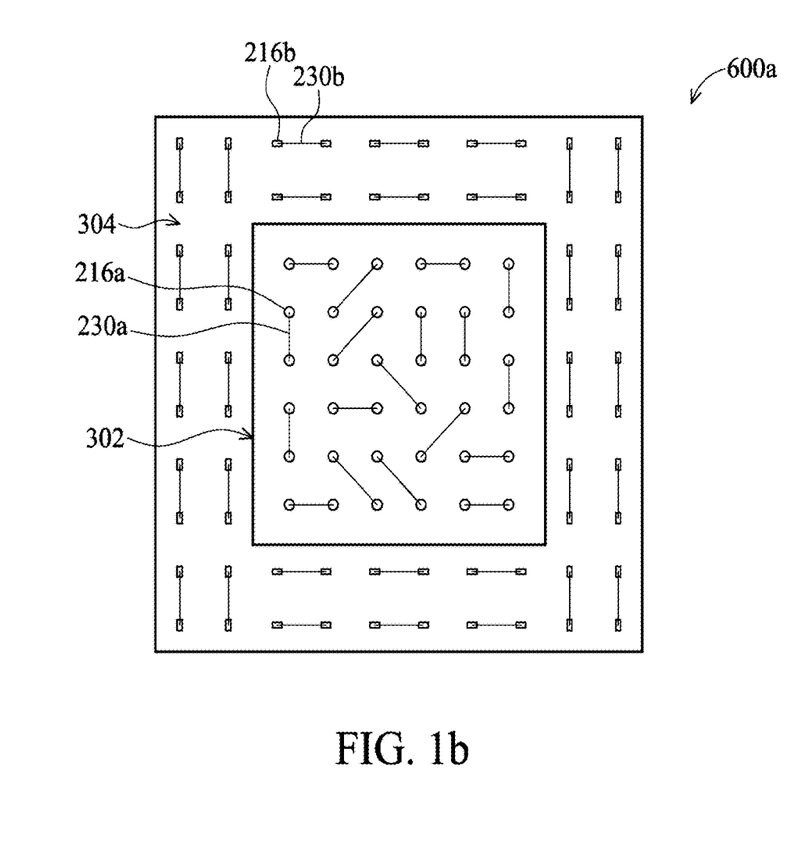
FIG. 1b shows a schematic view of a layout of conductive bumps of one exemplary embodiment of a semiconductor package of the invention.

FIG. 1b shows a schematic view of a layout 600a of conductive bumps 216a and 216b of one exemplary embodiment of the semiconductor package 500a of the invention. As shown in FIGS. 1a and 1b, it is noted that an area A1 of each of the conductive bumps 216a arranged in the central area 302 is designed to be larger than an area A2 of the conductive bumps 216b arranged in the peripheral area 304 to increase thermal conductivity and reduce electrical resistively, thereby improving thermal and electrical properties of the semiconductor package 500. In one embodiment as shown in FIGS. 1 and 2, an area ratio A1/A2 of each of the conductive bumps 216a to each of the conductive bumps 216b from a top view is larger than 1, and less than or equal to 3. In this embodiment, the area ratio A1/A2 of each of the conductive bumps 216a to each of the conductive bumps 216b from a top view is substantially equal to 1.5. In one embodiment, the conductive bumps 216a arranged in the central area 302 are designed in a shape different from that of the conductive bumps 216b arranged in the peripheral area 304 from the top view. For example, the conductive bumps 216a are designed in a circular shape and the conductive bumps 216b are designed in an oblong shape from the top view. Further, the conductive pillars 212a arranged in the central area 302 are designed in a shape substantially the same at that of the conductive bumps 216a. The conductive pillars 212b arranged in the peripheral area 304 are designed in a shape substantially the same at that of the conductive bumps 216b from the top view. Accordingly, the conductive pillars 212a are designed in a circular shape and the conductive pillars 212b are designed in an oblong shape from the top view. Moreover, an area of each of the conductive pillars 212a arranged in the central area 302 is designed substantially the same at that of the area A1 of each the conductive bumps 216a. An area of each of the conductive pillars 212b arranged in the peripheral area 304 is designed substantially the same at that of the area A2 of each of the conductive bumps 216b from the top view. Therefore, in one embodiment as shown in FIGS. 1 and 2, an area ratio A1/A2 of each of the conductive pillars 212a to each of the conductive pillars 212b from a top view is larger than 1, and less than or equal to 3. In this embodiment, the area ratio A1/A2 of each of the conductive pillars 212a to each of the conductive pillars 212b from a top view is substantially equal to 1.5.

Additionally, the semiconductor package 500a can be bonded to a substrate 300, for example, a print circuit board (PCB), as shown in FIG. 1a. In one embodiment, an underfill material 224 may optionally fill a space between the semiconductor package 500a and the substrate 300. In one embodiment, the substrate 300 has conductive traces 230a and 230b disposed thereon. In this embodiment, the conductive traces 230a are arranged in the central area 302, and the conductive traces 230b are arranged in the peripheral area 304. In one embodiment, the substrate 200 may be formed of by semiconductor materials such as silicon, or organic materials such as bismaleimide triacine, (BT), polyimide or ajinomoto build-up film (ABF). In one embodiment, the conductive traces 230a arranged in the central area 302 may be designed as ground/power trace segments, and the second conductive traces 230b arranged in the peripheral area 304 may be designed as signal trace segments for routing. Also, the conductive traces 230a and 230b are used for input/output (I/O) connections of a semiconductor die 310 mounted directly onto the substrate 200. Therefore, each of the conductive traces 230a and 230b has a portion serving as a pad region of the substrate 200. FIG. 1b also shows a relationship between the conductive traces 230a/230b and the conductive bumps 216a/216b of one exemplary embodiment of the semiconductor package 500 of the invention. Terminal portions of the conductive traces 230a overlap with the conductive bumps 216a in the central area 302, and terminal portions of the conductive traces 230b overlap with the conductive bumps 216b in the peripheral area 304.

Figure 2A:
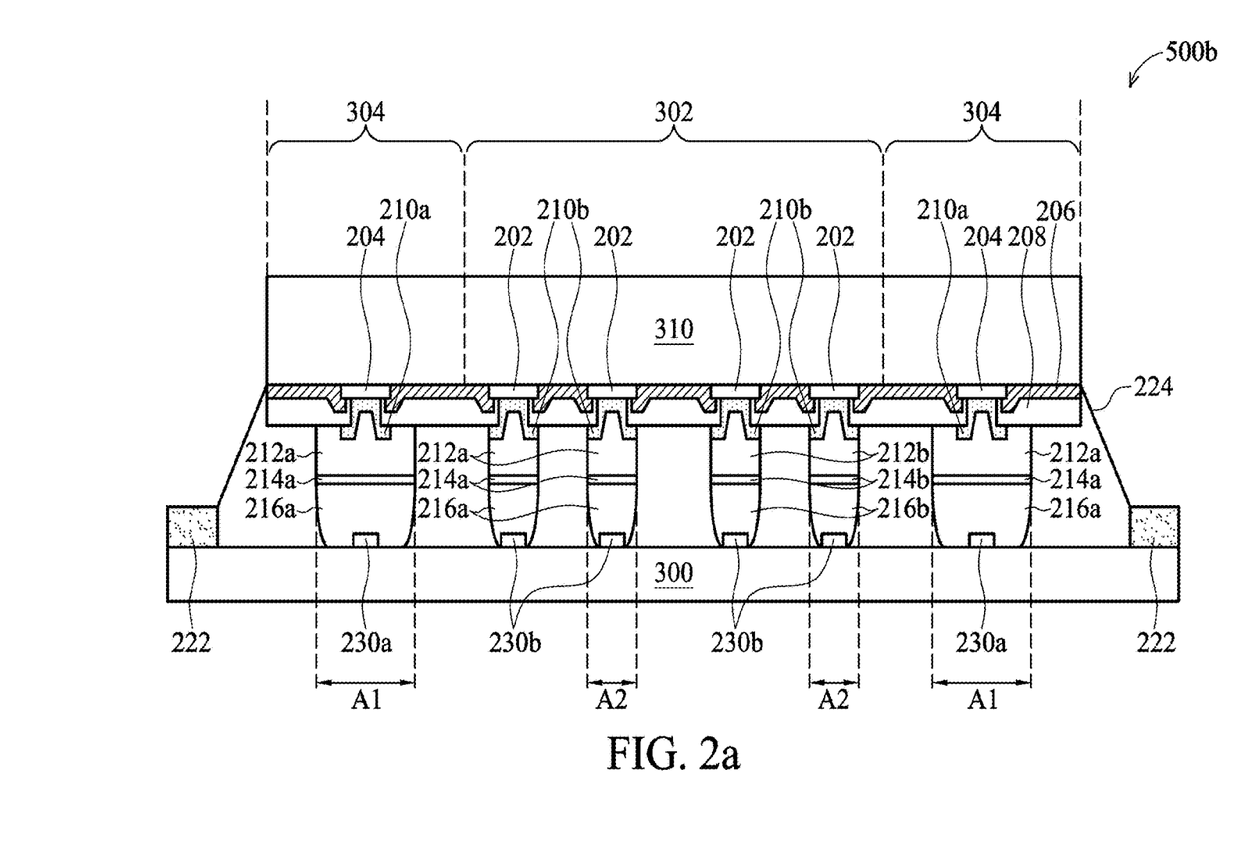
FIG. 2a shows a cross section view of another exemplary embodiment of a semiconductor package of the invention.
Figure 2B:
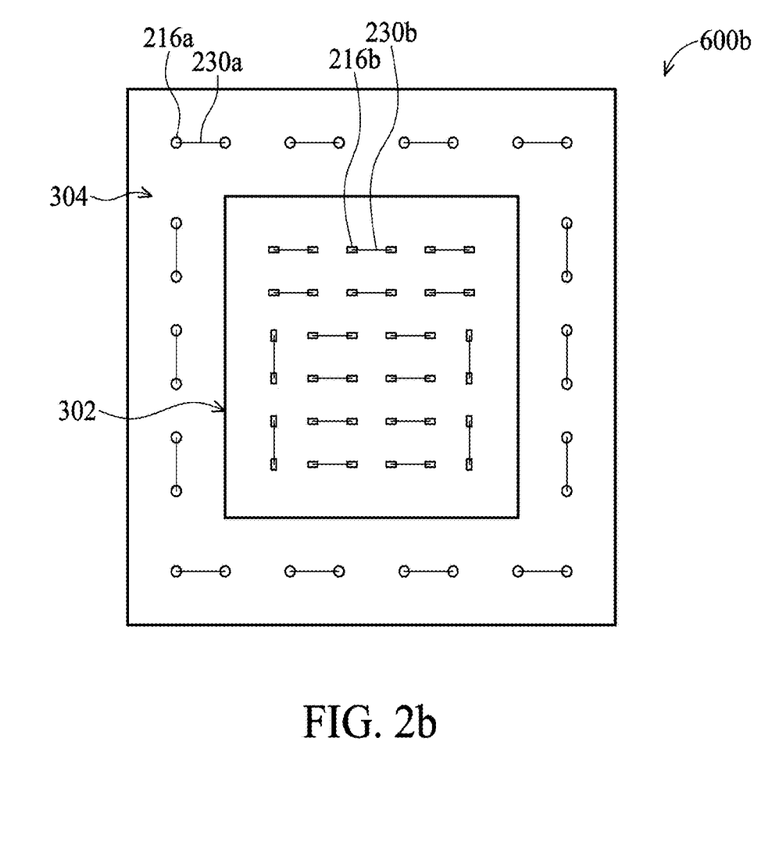
FIG. 2b shows a schematic view of a layout of conductive bumps of another exemplary embodiment of a semiconductor package of the invention.

In another embodiment, positions of the metal pads 202 and 204 can be exchanged. FIG. 2a shows a cross section view of another exemplary embodiment of a semiconductor package 500b of the invention. FIG. 2b shows a schematic view of a layout 600b of conductive bumps of another exemplary embodiment of a semiconductor package 500b of the invention. Elements of this embodiment which are the same as those previously described in FIGS. 1a and 1b, are not repeated for brevity. Differences between the semiconductor packages 500a and 500b (the layouts 600a and 600b) are that the metal pads 204 of the semiconductor package 500b for power/ground connections are arranged in the peripheral area 304. Also, the metal pads 202 of the semiconductor package 500b for power/ground connections are arranged in the central area 302.

Figure 3A:
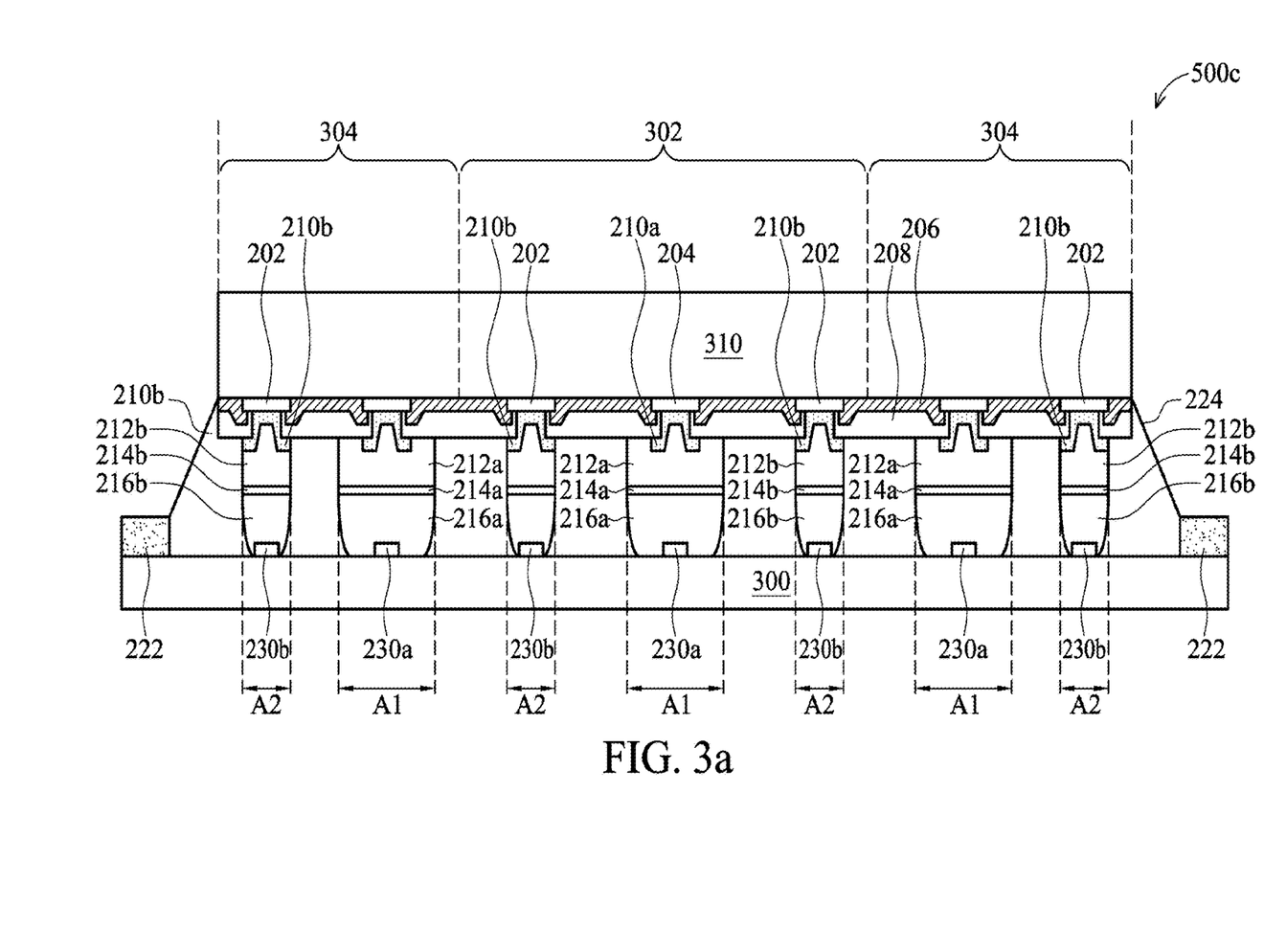
FIG. 3a shows a cross section view of yet another exemplary embodiment of a semiconductor package of the invention.
Figure 3B:
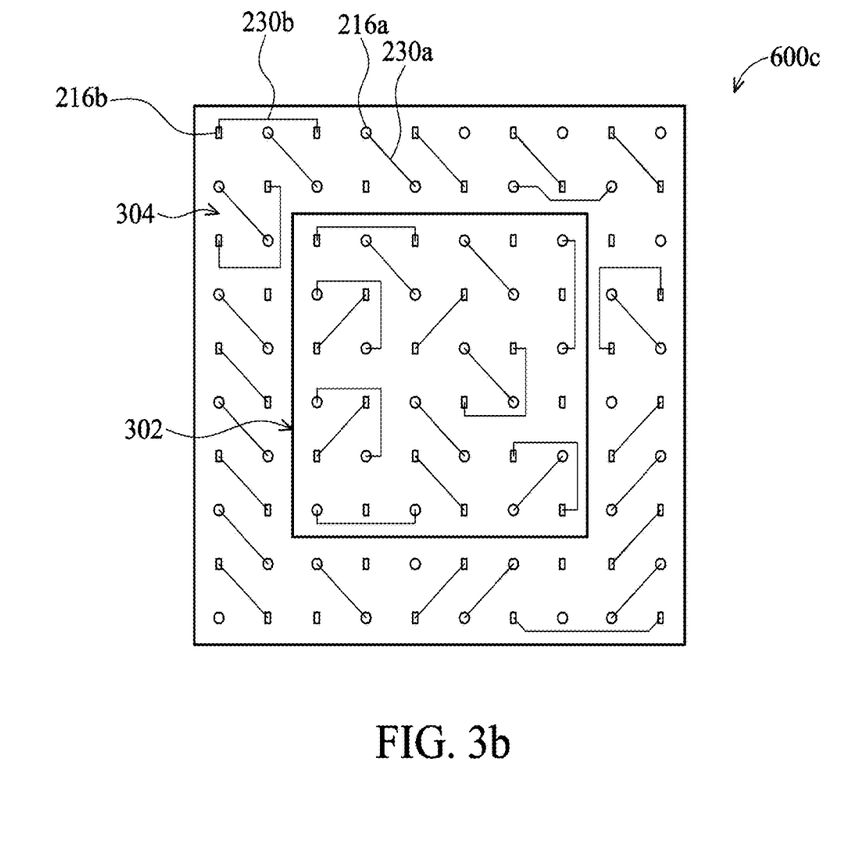
FIG. 3b shows a schematic view of a layout of conductive bumps of yet another exemplary embodiment of a semiconductor package of the invention.

In yet another embodiment, the metal pads 202 and 204 can be arranged both in the central area 302 and the peripheral area 304. Also, the metal pads 202 and 204 can be alternatively arranged in the central area 302 or the peripheral area 304. FIG. 3a shows a cross section view of yet another exemplary embodiment of a semiconductor package 500c of the invention. FIG. 3b shows a schematic view of a layout 600c of conductive bumps of yet another exemplary embodiment of a semiconductor package 500c of the invention. Elements of this embodiment which are the same as those previously described in FIGS. 1a and 1b, are not repeated for brevity. As shown in FIGS. 3a and 3b, the metal pads adjacent to any one of the metal pads 202 are the metal pads 204. Also, the metal pads adjacent to any one of the metal pads 204 are the metal pads 202.

Figure 4A:
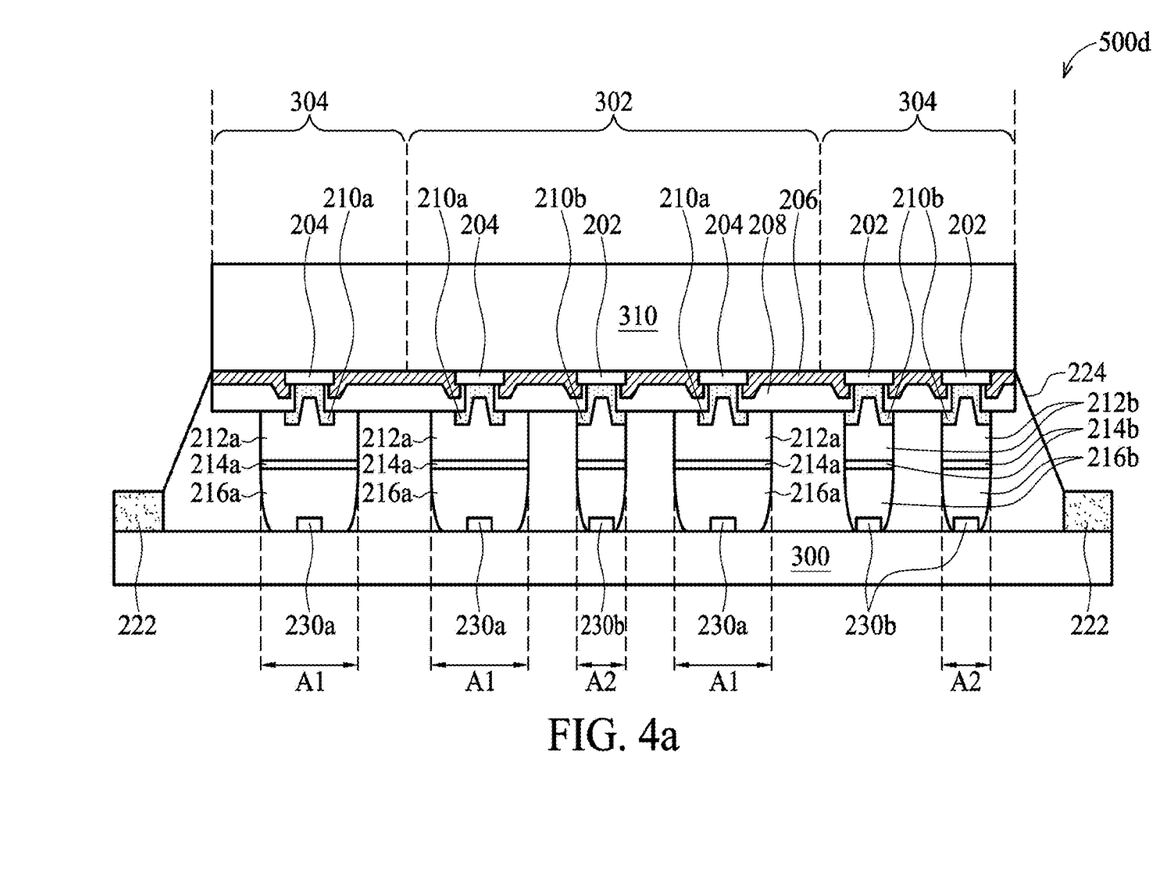
FIG. 4a shows a cross section view of still yet another exemplary embodiment of a semiconductor package of the invention.
Figure 4B:
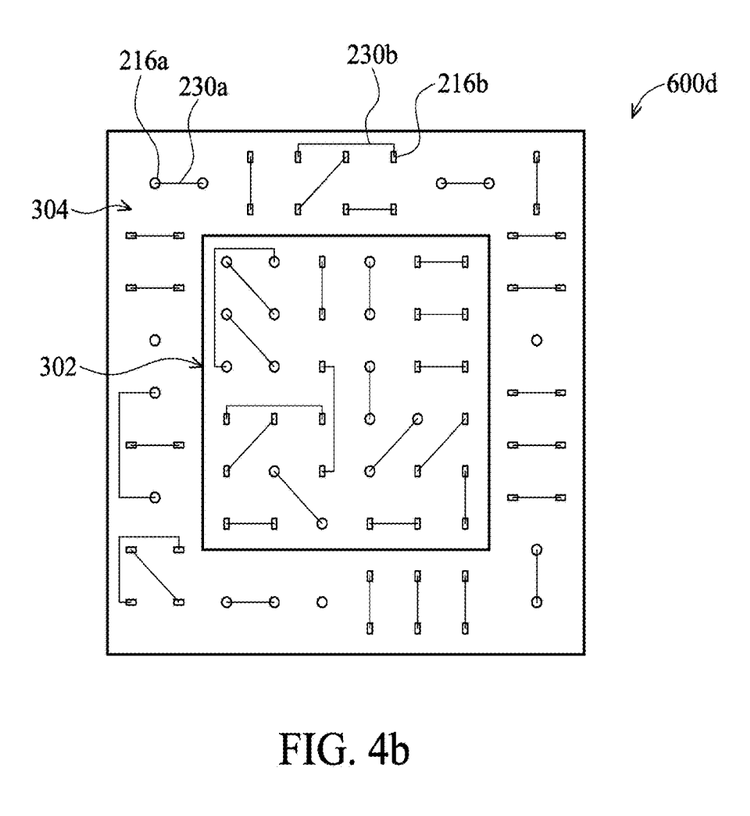
FIG. 4b shows a schematic view of a layout of conductive bumps of still yet another exemplary embodiment of a semiconductor package of the invention.

In still yet another embodiment, the metal pads 202 and 204 can be arranged both in the central area 302 and the peripheral area 304. Also, the metal pads 202 and 204 can be randomly arranged in the central area 302 or the peripheral area 304. FIG. 4a shows a cross section view of still yet another exemplary embodiment of a semiconductor package 500d of the invention. FIG. 4b shows a schematic view of a layout 600d of conductive bumps of still yet another exemplary embodiment of a semiconductor package 500d of the invention. Elements of this embodiment which are the same as those previously described in FIGS. 1a and 1b, are not repeated for brevity. As shown in FIGS. 4a and 4b, any one of the metal pads 202 can be adjacent to the metal pads 202 or 204. Also, any one of the metal pads 204 can be adjacent to the metal pads 202 or 204.

Exemplary embodiments provide a semiconductor package. The semiconductor package is designed to arrange conductive bumps with two different areas (sizes) in one semiconductor package. Because the power/ground connections of the semiconductor chip 301 has a number much less than the signal connections, a minimum pitch of the metal pads 204 for power/ground connections may be designed larger than a minimum pitch designed for the metal pads 202 for signal connections. An area A1 of each of the conductive bumps 216a connecting the metal pads 204 is designed to be larger than an area A2 of the conductive bumps 216b connecting the metal pads 202 to increase thermal conductivity and reduce electrical resistively, thereby improving thermal and electrical properties of the semiconductor package 500. In one embodiment as shown in FIGS. 1a and 1b, an area ratio A1/A2 of each of the conductive bumps 216a to each of the conductive bumps 216b from a top view is larger than 1, and less than or equal to 3. In this embodiment, the area ratio A1/A2 of each of the conductive bumps 216a to each of the conductive bumps 216b from a top view is substantially equal to 1.5. In one embodiment, the conductive bumps 216a arranged in the central area 302 are designed in a shape different from that of the conductive bumps 216b arranged in the peripheral area 304 from the top view.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A semiconductor package, comprising:
   a semiconductor die having a metal pad, a first passivation layer contacting a first side of the metal pad, and a second passivation layer contacting the first side of the metal pad;
   an under bump metallurgy layer contacting the first side of the metal pad;
   a substrate having at least a first conductive region and a second conductive region;
   a first conductive bump structure disposed on the first conductive region, the first conductive region being electrically connected to the semiconductor die via the first conductive bump structure, wherein the first conductive bump structure has a first area, and wherein the first conductive bump structure comprises a first copper pillar, a first conductive bump contacting the first conductive region, and a first conductive buffer layer between the first conductive bump and the first copper pillar; and
   a second conductive bump structure disposed on the second conductive region, the second conductive region being electrically connected to the semiconductor die via the second conductive bump structure, wherein the second conductive bump structure has an second area that is larger than the first area, and wherein the second conductive bump structure comprises a second copper pillar contacting at least a portion of the second passivation layer and at least a portion of the under bump metallurgy layer, a second conductive bump contacting the second conductive region, and a second conductive buffer layer between the second conductive bump and the second copper pillar.

2. The semiconductor package of claim 1, wherein the first passivation layer comprises a material selected from the group consisting of oxide, nitride and oxynitride.

3. The semiconductor package of claim 1, wherein the second passivation layer comprises a polymer.

4. The semiconductor package of claim 3, wherein the polymer comprises polyimide.

5. The semiconductor package of claim 1, wherein the first conductive bump structure contacts the second passivation layer.

6. The semiconductor package of claim 1, wherein the under bump metallurgy layer is in contact with the second passivation layer and the first conductive bump structure.

7. The semiconductor package of claim 1, wherein a ratio of the first area to the second area is greater than one and less than or equal to three.

8. A semiconductor package, comprising:
a semiconductor die having a metal pad, a passivation layer contacting a first side of the metal pad;
an under bump metallurgy layer contacting the first side of the metal pad;
a substrate having at least a first conductive trace and a second conductive trace;
a first conductive bump structure disposed on the first conductive trace, the first conductive trace being electrically connected to the semiconductor die via the first conductive bump structure, wherein the first conductive bump structure has a first area, and wherein the first conductive bump structure comprises a first copper pillar, a first conductive bump contacting the first conductive trace, and a first conductive buffer layer between the first conductive bump and the first copper pillar; and
a second conductive bump structure disposed on the second conductive trace, the second conductive trace being electrically connected to the semiconductor die via the second conductive bump structure, wherein the second conductive bump structure has an second area that is larger than the first area, and wherein the second conductive bump structure comprises a second copper pillar contacting at least a portion of the passivation layer and at least a portion of the under bump metallurgy layer, a second conductive bump contacting the second conductive trace, and a second conductive buffer layer between the second conductive bump and the second copper pillar.

9. The semiconductor package of claim 8, wherein the first conductive trace has a terminal portion that overlaps with the first conductive bump structure.

10. The semiconductor package of claim 8, wherein the first conductive bump structure contacts a top of the first conductive trace and a plurality of sides of the first conductive trace.

11. The semiconductor package of claim 8, wherein the first conductive buffer layer comprises nickel.

12. The semiconductor package of claim 8, wherein the passivation layer is a second passivation layer and the semiconductor die further comprises:
a first passivation layer contacting a first side of the metal pad.

13. The semiconductor package of claim 12, wherein the first passivation layer comprises a material selected from the group consisting of oxide, nitride and oxynitride.

14. The semiconductor package of claim 12, wherein the second passivation layer comprises a polymer.

15. The semiconductor package of claim 14, wherein the polymer comprises polyimide.

16. The semiconductor package of claim 12, wherein the first conductive bump structure contacts the second passivation layer.

17. The semiconductor package of claim 16, wherein the under bump metallurgy layer is in contact with the second passivation layer and the first conductive bump structure.

18. The semiconductor package of claim 8, wherein the substrate is a printed circuit board.

19. The semiconductor package of claim 1, wherein the first conductive buffer layer comprises nickel.

* * * * *